United States Patent [19]
MacDiarmid et al.

[11] Patent Number: 4,910,522
[45] Date of Patent: Mar. 20, 1990

[54] ELECTROMAGNETIC TEST METHOD

[75] Inventors: Ian P. MacDiarmid; Carl P. Loller, both of Lancashire, England

[73] Assignee: British Aerospace Public Limited Company, London, England

[21] Appl. No.: 118,696

[22] Filed: Nov. 5, 1987

[30] Foreign Application Priority Data

Oct. 15, 1987 [GB] United Kingdom ............... 8723817

[51] Int. Cl.⁴ .................. G01S 7/40; G01R 1/24; G21L 1/00
[52] U.S. Cl. .................. 342/165; 343/703; 376/156
[58] Field of Search ............ 343/703; 324/228, 231, 324/263, 455; 361/230-235; 342/165; 376/156; 333/263

[56] References Cited

U.S. PATENT DOCUMENTS 4,546,358 10/1985 Edlin et al. .................. 343/703

Primary Examiner—Nelson Moskowitz
Assistant Examiner—Gregory C. Issing
Attorney, Agent, or Firm—Cushman, Darby & Cushman

[57] ABSTRACT

An electromagnetic test method simulates the effects of plane electromagnetic wave illumination on a conducting body. A conductive sheet is placed in the vicinity of the body and connected to an electrical ground. Alternating current from a current generator is injected into the conducting body via electrodes positioned at spatially separated points on the body's surface. The fields generated by the injected currents and the mirror currents in the grounded conducting sheet induce fields which create an overall current distribution in the conducting body substantially identical with that resulting from the incidence of a plane electromagnetic wave upon the body.

6 Claims, 1 Drawing Sheet

ELECTROMAGNETIC TEST METHOD

BACKGROUND TO THE INVENTION:

The present invention relates to a test technique to simulate the plane electromagnetic (EM) wave illumination of a conducting body. Such techniques are used in the testing of military vehicles such as aircraft for resistance to the effects of high intensity wide-band electromagnetic radiation. In the past such testing has been carried out simply by using antennae and appropriate generating equipment. In order to generate high intensity fields around a body as large as an aircraft such systems have necessarily been physically large and have had very high power consumption levels. In addition to being expensive to build and run such systems suffer the further disadvantage that they create high levels of radio frequency interference.

Illumination of conducting bodies at radio frequencies extending up to substantially 30 MHz is particularly difficult because of the large size of efficient radiation structures for these frequencies and the difficulty of focusing the radiated power on the body to be illuminated. Moreover it is found that at frequencies where the wavelength is 10's or 100's of metres that inductive coupling between the antenna and the aircraft occurs thereby distorting the electromagnetic field creating fields with spherical wavefronts and non-uniform field strengths. This distortion of the field severely restricts the diagnostic value of the test procedure.

SUMMARY OF THE INVENTION

According to the present invention, a test technique for the simulation of plane electromagnetic wave (EM) illumination of a conducting body includes the step of connecting a high frequency current to said body via a multi-point feed system arranged to produce a distribution of surface current on the body substantially identical to that generated by the body's exposure to a plain electromagnetic wave. In order to provide the required field characteristics a suitably shaped conducting sheet is placed close to the body but not in electrical contact with the body.

If the surface current distribution on the body is the same as that obtained during illumination by a plane electromagnetic wave then the internal electromagnetic environment will be identical. The coupling of energy from the external field to currents induced on internal wiring within the conducting body is therefore simulated accurately. Any apertures in the body may be ignored from the point of view of electric field polarizibility where the materials concerned are moderate to good shields in the frequency hands used. If this is not the case then the value of normal field strength around the body must also be arranged to be equal to the scattered normal field in addition to the current distribution.

BRIEF DESCRIPTION OF THE DRAWINGS:

A particular example of an apparatus in accordance with the present invention will now be described with reference to the accompanying drawings, in which.

Figure 1:
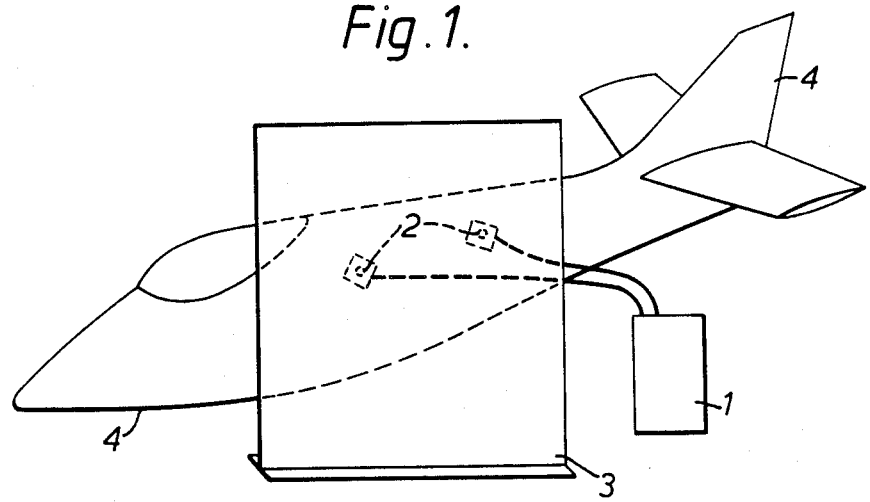
FIG. 1 is a diagram of an apparatus in accordance with the present invention in use in testing an aircraft fuselage.
Figure 2:
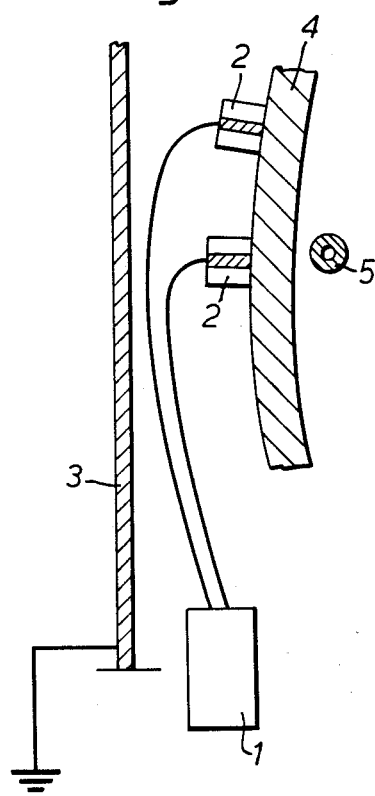
FIG. 2 is a partially sectioned end elevation of an apparatus in accordance with the present invention in use.

DESCRIPTION OF THE PREFERRED EXAMPLE:

An apparatus for testing conducting bodies to simulate the effects of plane electromagnetic illumination of such bodies includes an alternating current generator capable of generating current at frequencies up to 30 MHz and electrodes 2 connected to the generator. The apparatus further comprises a planar metal sheet 3 having dimensions of substantially the same order of magnitude as the body to be tested.

In use the electrodes 2 are placed on an outer surface of the body to be tested. This body will typically be an aircraft fuselage 4. The conducting sheet 3 is placed close to the fuselage 4 but spaced apart from the fuselage 4 so that it is not in electrical contact. The conducting sheet 3 is then electrically grounded.

Current from the generator 1 is injected via the electrodes 2 into the surface of the fuselage 4. These currents in turn induce mirror currents in the conducting sheet 3. These in turn modify the current flow in the surface of the fuselage 4 to produce the desired current distribution in the surface corresponding to that produced by a plane electromagnetic wave impinging on the surface. For given boundary conditions around a closed surface there is a unique solution for the electric field within the surface. Therefore by creating the boundary conditions on the surface of the fuselage 4 characteristic of those produced by a plane electromagnetic wave a field is created within the fuselage 4 which is substantially identical to that resulting from illumination by a plane electromagnetic wave. The present apparatus is therefore able to simulate, for example, the effects of such a wave on components of the aircraft such as internal wiring routes 5.

Although in the example described the conducting sheet 3 is flat other forms, such as a sheet configured to follow the curvature of the body being tested, may be used. The relationship between the conducting sheet 3 and the position and magnitude of the injected current necessary to effectively simulate a plane electromagnetic wave are discussed more fully in the detailed theoretical discussion contained in the appendix.

APPENDIX

1. Introduction

The purpose of this document is to describe the exact purpose of direct current injection (DCI), the concept of the DCI technique and the underlying mathematical theory.

2. The Concept of DCI

The following sections will explain;

(a) the idea of natural impedance paths on a conducting body (b) how these impedance values may be used to compute the current distribution on a body undergoing EM illumination (c) how the presence of a nearby conducting ground plane affects the impedance on a body (d) a mathematical statement of the objective of DCI in terms of the above (e) considerations for an injection arrangement to achieve the simulation of plane wave illumination for two and three dimensional shapes 2.1. Natural Impedance Paths Consider the cross section through a rectangular conductor (such as the CFC cylinder) as shown in FIG. ( ). Let RF current be introduced so that it flows along the length (z-axis, into the paper) of the conductor. It is known that the current will distribute itself circumferentially around the perimeter of the rectangle, and that a high frequencies (>100 KHz) the majority of the current will flow along the sharp corner regions. The reason for this is easily explained using elementary physics.

Take the cross section and divide it into N equal width strips. The applied voltage along the unit length (into the paper) of any one of the strips is equal for each and every incremental strip, yet the current flowing along each will differ according to position. The impedance presented by each strip is therefore dependent upon position. The impedance of any conducting path at high frequency will be determined by the magnitude of the TOTAL magnetic flux density linking that path. This is simply a statement of Lenz's law $$V = -L\frac{di}{dt} = \frac{-d\phi}{dt} = -jw\phi \qquad (1)$$

Thus, those paths linking fewest lines of magnetic flux, 0, will have the lowest impedance (inductive reactance). It can be easily seen therefore that the corner regions will link the smallest amount of total flux as they are the furthest removed regions on the body and flux-fields fall away with increased spacing.

The impedance of any general strip, m, is given by $$Z(m) = L(m) + M(1,m) + M(2,m) + M(3,m) + \ldots M(N,m) \qquad (2)$$
$$= L + \sum_{n=1}^{N} M(n,m)$$

where L(m) is the self-inductive reactance of path m, and is the same for each of the equal strip widths and may be written as L, and M(n,m) is the mutual inductive coupling reactance between strip n and strip m.

The form of L and M(n,m) has been given in reference [3] and is given by $$L = \frac{\eta K P}{2N}\left\{\frac{1-j}{4} - \text{Log}_e\left(\frac{YKP}{4N}\right)\right\} \qquad (3)$$

and $$M(n,m) = \frac{\eta K}{4}\int H_o^{(1)}(K|Rn - Rm|) \cdot dl' \qquad (4)$$

where
P is the total perimeter length of the body (m)
N is the number of strip segments
K is the wave number for the frequency (a)
n is the free space wave impedance (Ohm)
Y is Eulers constant and
$H_o^{(1)}(K|\overline{Rn}-\overline{Rm}|)$ is a Hankel function (zero order, 2nd kind) relating the field or flux quantity at vector position $\overline{Rn}$ to the specified point $\overline{Rm}$. $H_o^{(2)}$ is a complex combination of Bessel functions and is a term most suitable for representing the damped and sinusoidally-varying real and complex terms of an emanating wave field.

Thus the term that actually determines whether a path will have high or low impedance is the second summation in equation (2), and each of those terms are related to the spacing, $|\overline{Rn}-\overline{Rm}|$. The larger $|\overline{Rn}-\overline{Rm}|$, the smaller the magnitude of $H_o^{(2)}(K|\overline{Rn}-\overline{Rm}|)$.

Equation (2) will yield a value of Z for each and everyone of the N paths and we may write this in the matrix form below for the total surface impedance linking matrix $$[Zn] = \begin{bmatrix} L(1) & M(2,1) & M(3,1) & \ldots & M(N,1) \\ M(1,2) & L(2) & M(3,2) & \ldots & M(N,2) \\ M(1,3) & M(2,3) & L(3) & \ldots & M(N,3) \\ & & \cdot & & \\ & & \cdot & & \\ & & \cdot & & \\ M(1,N) & M(2,N) & M(3,N) & \ldots & L(N) \end{bmatrix} \qquad (5)$$

This may be termed the 'natural' impedance of the body (portioned into N segments) and will allow us to calculate the (N) induced surface current values distributed on the body via either plane wave EM illumination or indeed by end- current injection.

It is this natural impedance compounded with the incident field conditions that determines the surface currents induced on the exterior of the body when illuminated by a plane wave EM field.

2.2 Current Induced by EM Illumination

We have computed the 'natural' impedance of the body. Without entering the realms of the numerical technique in too great a detail, the induced surface currents on the exterior of the conducting body may be computed from the simple matrix equation $$[E^i] = [Zn] \cdot [J_s] \qquad (6)$$

where
[E] is a matrix of values of the incident plane wave EM field over the surface
[Z] is the natural impedance matrix
[Js] is the induced currents Hence, we can solve for the plane-wave induced surface currents at the N segment locations simply by inverting the [Z]matrix and producing with the [E]matrix:

$$[E^i] \cdot [Zn]^{-1} = [J_s] \qquad (7)$$

2.3. Modifications of Natural Impedance Paths

It is possible to modify or perturb the natural impedance path values of all, or some, of the segments of the body by the use of a ground or earthed plane.

When we site a conducting body above an earthed plane, and induce RF current flow on the body, a scattered EM field will be set up around the object with the provision that the TOTAL electric field tangential to the surface of the earth plane will be zero for all points on it's surface.

The most common and simplest way of visualising this is to imagine the creation of a virtual image of the conducting object created on equal depth away from the ground plane but on the opposite side to the real object. See FIG. (2). This concept is identical to that used in mirror optics.

The plane-tangential currents in the virtual image will flow in the opposite sense to those in the actual conductor and hence the total electric field at the mid point between them (ie. the earth plane) is entirely cancelled.

This also has the effect that the flux coupling with each of the N segmental paths on the real conducting body is modified since the effective flux coupling with each now takes the form;

$$Z'(m) = L(m) + M(1,m) + M(2,m) + \ldots M(N,m) + M'(1,m) + M'(2,m) + \ldots M'(N,m) \quad (8)$$

$$= L + \sum_{n=1}^{N} M(n,m) + \sum_{n=1}^{N} M'(n,m)$$

where $M'(n,m)$ is the inductive coupling reactance with the image in the earth plane, and $Z'(m)$ refers to the modified impedance of path m, and differs from the natural impedance $Zn(m)$ by the third term in equation (8).

It should be noted that the magnitude of this new third term is dependent upon the closeness of the conducting body to the earth plane: it is a function of the spacing, R.

Now consider what would happen if we did not use a planar ground sheet, but an arbitrary surface instead. The currents flowing on the conducting body would still form an image, of distorted shape certainly, to counteract the scattered fields so that at the ground plane, the total tangential electric field components remained zero. The impedance paths on the body will be some other value, $Z''(m)$, different from those both in equations (2) and (8), and the current distribution for a given EM stress will be distinctly different once again.

We now begin to see that we may manipulate, in theory at least, the impedance paths on the body to be ANY value we so choose, thus controlling the current distribution on the body for any given EM stress conditions, whether that may be plane wave illumination or current injection.

2.4. The objective of DCI: A Mathematical Statement

It is the stated objective of the Direct Current Injection (DCI) technique to simulate the external surface current distribution on the conducting body by means other than by free-field. HF band plane-wave illumination which is very demanding to reproduce at the field strength levels required in the HF band (far field).

From a consideration of the previous three sections, it should now be clear that given we can stimulate or excite the airframe at a specified, and limited, number of points on the body, the exciting matrix set [Ee] is thus set.

If we are to achieve the desired current distribution, represented in it's matrix form at the N locations on the body as [Js], then we must achieve the balance given by $$[Js] = [Zn]^{-1}[Ei] = [Zp^{-1}[Ee] \quad (9)$$

which is a statement of

| Desired Surface Currents | = | Plane Wave Excitation | * | Natural Impedance Matrix | = |

| Injection Excitation Set | * | Perturbed Impedance Matrix |

The perturbed impedance matrix set, [Zp], to be sought is therefore mathematically defined in equation (9).

2.5. Considerations for an Injection System

We are free to choose either the ground plane shape and then accept the injection point positions, levels and relative phases so defined, or alternatively, fix the injection system and thus accept the ground plan shape defined.

It is more than likely that the injection arrangement and ground plane shape will vary with frequency, but in the light of experience from RAE predictions on the CFC fuselage, we do not expect the shape or distribution of either to vary considerably over the LIMITED frequency range (1–30 MHz) of our interest.

We believe that a 'sensible' choice of ground plane should be chosen to envelop the body, compute the perturbed impedance and hence the injection levels. This may need to be an iterative process.

We claim:

1. A method of testing a conducting body to simulate plane EM illumination of said body comprising the steps of:
   placing a conducting sheet adjacent said body,
   maintaining said conducting sheet at a fixed reference voltage,
   placing electrodes in contact with an outer surface of said body at spatially separated points on said body, and
   injecting alternating currents into said body via said electrodes thereby creating a current distribution in said body characteristic of plane EM wave illumination.

2. The method of claim 1, wherein said alternating current has frequencies in the range 1 to 30 MHz.

3. The method of claim 2, wherein said conducting sheet is earthed.

4. An apparatus for testing a conducting body to simulate plane EM illumination of said body comprising:
   an alternating current generator,
   electrodes operatively connected to said generator, and
   a conducting sheet,
   means for applying a fixed reference voltage to said conducting sheet, said electrodes being arranged to be fixed on an outer surface of said body and to inject alternating current into said body thereby creating in conjunction with said conducting sheet a current distribution in said body characteristic of plane electromagnetic wave illumination.

5. The apparatus of claim 4, wherein said conducting sheet is substantially flat.

6. The apparatus of claim 4, wherein said conducting sheet is curved, the conducting sheet being arranged so that when it is used different regions of said sheet are substantially at a single fixed distance from said outer surface of said body.

* * * * *